(12) United States Patent
Na et al.

(10) Patent No.: US 10,128,026 B2
(45) Date of Patent: Nov. 13, 2018

(54) SUPERCONDUCTING WIRE

(71) Applicant: LS CABLE & SYSTEM LTD., Anyang-si, Gyeonggi-do (KR)

(72) Inventors: Jin Bae Na, Seoul (KR); Young Woong Kim, Suwon-si (KR); Chang Youl Choi, Ansan-si (KR); Cheol Hwi Ryu, Gimpo-si (KR); Seok Ju Lee, Changwon-si (KR)

(73) Assignee: LS CABLE & SYSTEM LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/740,559

(22) PCT Filed: Jun. 23, 2016

(86) PCT No.: PCT/KR2016/006646
§ 371 (c)(1),
(2) Date: Dec. 28, 2017

(87) PCT Pub. No.: WO2017/003127
PCT Pub. Date: Jan. 5, 2017

(65) Prior Publication Data
US 2018/0182513 A1    Jun. 28, 2018

(30) Foreign Application Priority Data

Jun. 30, 2015 (KR) .................. 10-2015-0092921
Sep. 9, 2015 (KR) .................. 10-2015-0127565

(51) Int. Cl.
| | | |
|---|---|---|
| H01B 12/00 | (2006.01) | |
| H01B 12/06 | (2006.01) | |
| H01L 39/00 | (2006.01) | |
| H01B 1/02 | (2006.01) | |
| H01B 1/06 | (2006.01) | |
| H01B 12/16 | (2006.01) | |

(Continued)

(52) U.S. Cl.
CPC .............. *H01B 12/06* (2013.01); *H01B 1/02* (2013.01); *H01B 1/06* (2013.01); *H01B 12/00* (2013.01); *H01B 12/16* (2013.01); *H01B 13/22* (2013.01); *H01L 39/00* (2013.01); *H01L 39/248* (2013.01); *Y02E 40/64* (2013.01)

(58) Field of Classification Search
CPC ........ H01L 39/00; H01L 39/248; Y02E 40/64
USPC ...................................... 174/125.1
See application file for complete search history.

(56) References Cited

U.S. PATENT DOCUMENTS

| | | | | |
|---|---|---|---|---|
| 2004/0102329 A1* | 5/2004 | Mele | ................. | H01B 12/06 505/100 |
| 2006/0073977 A1* | 4/2006 | Xie | ................. | G01R 33/1246 505/300 |

(Continued)

FOREIGN PATENT DOCUMENTS

| | | |
|---|---|---|
| KR | 100742501 B1 | 7/2007 |
| KR | 1020110033865 A | 3/2011 |

(Continued)

OTHER PUBLICATIONS

International Search Report for related International Application No. PCT/KR2016/006646; report dated Oct. 19, 2016; (4 pages).

*Primary Examiner* — William H Mayo, III
(74) *Attorney, Agent, or Firm* — K&L Gates LLP (57) ABSTRACT

A superconducting wire having improved electrical and physical properties.

15 Claims, 4 Drawing Sheets

(51) Int. Cl.
  *H01B 13/22*  (2006.01)
  *H01L 39/24*  (2006.01)

(56) References Cited

U.S. PATENT DOCUMENTS

| | | | | |
|---|---|---|---|---|
| 2011/0287943 A1* | 11/2011 | Fukushima | ......... | H01L 39/2461 |
| | | | | 505/230 |
| 2013/0196857 A1* | 8/2013 | Mukoyama | ............... | C01G 3/00 |
| | | | | 505/230 |
| 2013/0316908 A1* | 11/2013 | Fukushima | ......... | H01L 39/2461 |
| | | | | 505/230 |
| 2015/0248952 A1* | 9/2015 | Ko | ........................ | H01L 39/143 |
| | | | | 505/510 |
| 2015/0279519 A1* | 10/2015 | Higuchi | .............. | H01L 39/2461 |
| | | | | 505/230 |

FOREIGN PATENT DOCUMENTS

| | | |
|---|---|---|
| KR | 1020130107301 A | 10/2013 |
| KR | 1020140067495 A | 6/2014 |
| WO | 2010011739 A1 | 1/2010 |

\* cited by examiner

SUPERCONDUCTING WIRE

CROSS-REFERENCE TO RELATED APPLICATIONS

The present application is a National Stage of International Application No. PCT/KR2016/006646, filed Jun. 23, 2016, which claims priority to Korean Application No. 10-2015-0092921, filed Jun. 30, 2015 and Korean Application No. 10-2015-0127565, filed Sep. 9, 2015, the disclosures of which are incorporated herein by reference.

TECHNICAL FIELD

The present invention relates to a superconducting wire, and more particularly, a superconducting wire having improved electrical and physical properties.

BACKGROUND ART

A superconducting wire has an electric resistance converging close to zero at a certain temperature and thus has high power transfer capability even at a low voltage.

For a superconducting cable having the superconducting wire, a cooling method performed using a refrigerant such as nitrogen to form and maintain an extremely low temperature environment and/or an insulation method of forming a vacuum layer is employed.

Conventionally, tension or torsion may be continuously applied when superconducting wires for a superconducting cable are coiled around a drum or the like while being spirally wound around an outer surface of a former or the like to manufacture a superconducting cable or when the superconducting cable is bent in a cable installation area. Such stress may cause the superconducting wires having a thickness of only about 0.1 mm to be broken. In particular, since the cost of superconducting wires occupies a largest percentage of a total superconducting cable cost, the durability or physical reliability of the superconducting wires is required.

In addition, the superconducting wires should not be damaged or deformed when physical stress such as a tensile force or torsion is applied thereto, and stable electrical properties thereof should be guaranteed.

DETAILED DESCRIPTION OF THE INVENTION

Technical Problem

The present invention is directed to a superconducting wire having improved electrical and physical properties.

Technical Solution

According to an aspect of the present invention, there is provided a superconducting wire having a width of 0.4 mm to 0.5 mm and a thickness of 0.3 mm to 0.5 mm and formed of YBCO or ReBCO (here, Re=Sm, Gd, Nd, Dy, Ho) as a superconductive material, wherein a critical current DC Ic is in a range of 150 A to 500 A at a temperature of 77 K, under pressure of 1 atmosphere, and at a self-field And a critical current when bending stress is applied to the superconducting wire using two rollers each having a diameter of 35 mm after the superconducting wire is sequentially bent in different directions may be greater than or equal to 95% of the critical current DC Ic.

And a critical current when double bending stress is applied to the superconducting wire using four rollers each having a diameter of 50 mm after the superconducting wire is sequentially bent in different directions may be greater than or equal to 95% of the critical current DC Ic.

And a tensile critical current when a tensile force of 250 MPa or a tensile strength extending the superconducting wire by 0.2% is applied in a lengthwise direction of the superconducting wire may be greater than or equal to 95% of the critical current DC Ic.

And a torsion critical current when the superconducting wire is twisted at intervals of 200 mm in a lengthwise direction of the superconducting wire may be greater than or equal to 95% of the critical current DC Ic.

And a critical current when the superconducting wire is wound around a former of a superconducting cable at a pitch of about 220 mm and a load of 3 kg to 8 kg is applied in a lengthwise direction of the superconducting wire may be greater than or equal to 95% of the critical current DC Ic.

And the superconducting wire may be jointed in units of 200 meters to 400 meters, and a joint resistance value at jointed portions of the superconducting wire may be 200 nΩ or less.

And the joint resistance value at the jointed portions of the superconducting wire when the superconducting wire is wound around a former of a superconducting cable at a pitch of about 220 mm and a load of 3 kg to 8 kg is applied in a lengthwise direction of the superconducting wire may be 240 nΩ or less or may be greater by 20% or less than a joint resistance value at normal times.

And a critical current when the superconducting wire is immersed for 16 hours in liquid nitrogen having an internal pressure maintained at about 30 MPa is greater than or equal to 95% of the critical current DC Ic.

And the superconducting wire may not balloon when immersed for 16 hours in liquid nitrogen having an internal pressure maintained at about 30 MPa and when inspected with naked eyes.

And a slop of a voltage with respect to a current greater than or equal to the critical current DC Ic may be in a range of 25 to 30.

And alternating-current (AC) loss of the superconducting wire may be 0.4 W/kA*m or less.

And according to another aspect of the present invention, there is provided a A superconducting wire having a width of 0.4 mm to 0.5 mm and a thickness of 0.3 mm to 0.5 mm and formed of YBCO or ReBCO (here, Re=Sm, Gd, Nd, Dy, Ho) as a superconductive material, wherein a critical current DC Ic is in a range of 150 A to 500 A at a temperature of 77 K, under pressure of 1 atmosphere, and at a self-field, a critical current when bending stress is applied to the superconducting wire using two rollers each having a diameter of 35 mm after the superconducting wire is sequentially bent in different directions is greater than or equal to 95% of the critical current DC Ic, a critical current when double bending stress is applied to the superconducting wire using four rollers each having a diameter of 50 mm after the superconducting wire is sequentially bent in different directions is greater than or equal to 95% of the critical current DC Ic, a critical current when a tensile force of 250 MPa or a tensile strength extending the superconducting wire by 0.2% is applied in a lengthwise direction of the superconducting wire is greater than or equal to 95% of the critical current DC Ic, a critical current when the superconducting wire is twisted at intervals of 200 mm in the lengthwise direction is greater than or equal to 95% of the critical current DC Ic, a critical current when the superconducting wire is wound around a former of a superconducting cable at a pitch of about 220 mm and a load of 3 kg to 8 kg is applied in the lengthwise direction or when the superconducting wire is immersed for 16 hours in liquid nitrogen having an internal pressure maintained at about 30 MPa is greater than or equal to 95% of the critical current DC Ic, the superconducting wire is jointed in units of 200 meters to 4000 meters, a joint resistance value at jointed portions of the superconducting wire is 200 nΩ or less, a joint resistance value when the superconducting wire is wound around a former of a superconducting cable at a pitch of about 220 mm and a load of 3 kg to 8 kg is applied in the lengthwise direction of the superconducting wire is 240 nΩ or less or is greater by 20% or less than a joint resistance value at normal times, a slop of a voltage with respect to a current greater than or equal to the critical current DC Ic may be in a range of 25 to 30, and alternating-current (AC) loss of the superconducting wire is 0.4 W/kA*m or less.

And according to another aspect of the present invention, there is a superconducting wire having a width of 0.4 mm to 0.5 mm and a thickness of 0.3 mm to 0.5 mm and formed of YBCO or ReBCO (here, Re=Sm, Gd, Nd, Dy, Ho) as a superconductive material, wherein the superconducting wire does not balloon when immersed for 16 hours in liquid nitrogen having an internal pressure maintained at about 30 MPa and when inspected with naked eyes.

And according to another aspect of the present invention, there is A superconducting wire having a width of 0.4 mm to 0.5 mm and a thickness of 0.3 mm to 0.5 mm and formed of YBCO or ReBCO (here, Re=Sm, Gd, Nd, Dy, Ho) as a superconductive material, wherein a critical current DC Ic is in a range of 150 A to 500 A at a temperature of 77 K, under pressure of 1 atmosphere, and at a self-field, a critical current when bending stress is applied to the superconducting wire using two rollers each having a diameter of 35 mm after the superconducting wire is sequentially bent indifferent directions is greater than or equal to 95% of the critical current DC Ic, a critical current when double bending stress is applied to the superconducting wire using four rollers each having a diameter of 50 mm after the superconducting wire is sequentially bent in different directions is greater than or equal to 95% of the critical current DC Ic a critical current when a tensile force of 250 MPa or a tensile strength extending the superconducting wire by 0.2% is applied in a lengthwise direction of the superconducting wire is greater than or equal to 95% of the critical current DC Ic a critical current when the superconducting wire is twisted at intervals of 200 mm in the lengthwise direction is greater than or equal to 95% of the critical current DC Ic, a critical current when the superconducting wire is wound around a former of a superconducting cable at a pitch of about 220 mm and a load of 3 kg to 8 kg is applied in the lengthwise direction or when the superconducting wire is immersed for 16 hours in liquid nitrogen having an internal pressure maintained at about 30 MPa is greater than or equal to 95% of the critical current DC Ic, the superconducting wire is jointed in units of 200 meters to 4000 meters, a joint resistance value at jointed portions of the superconducting wire is 200 nΩ or less, a joint resistance value when the superconducting wire is wound around a former of a superconducting cable at a pitch of about 220 mm and a load of 3 kg to 8 kg is applied in the lengthwise direction of the superconducting wire is 240 nΩ or less or is greater by 20% or less than a joint resistance value at normal times, a slop of a voltage with respect to a current greater than or equal to the critical current DC Ic is in a range of 25 to 30, alternating-current (AC) loss of the superconducting wire is 0.4 W/kA*m or less, and the superconducting wire does not balloon when immersed for 16 hours in the liquid nitrogen having the internal pressure maintained at about 30 MPa and when inspected with naked eyes.

Advantageous Effects

The physical rigidity of a superconducting wire according to the present invention can be reinforced to withstand physical stress, such as a tensile force or torsion, applied thereto during the manufacture and installation of a superconducting cable.

The physical rigidity of the superconducting wire according to the present invention can be reinforced to prevent the superconducting wire from being broken and guarantee an electrical property of the superconducting wire, as well as the physical rigidity thereof against physical stress.

Furthermore, the physical rigidity of the superconducting wire according to the present invention during the manufacture, installation, and management of a superconducting cable can be improved and an electrical property thereof can be guaranteed, thereby preventing the occurrence of a short circuit or the like in the semiconducting wire and greatly decreasing manufacturing costs.

BEST MODE

Hereinafter, exemplary embodiments of the present invention will be described in detail with reference to the accompanying drawings. However, the present invention is not limited to the embodiments set forth herein and may be embodied in many different forms. Rather, these embodiments are provided so that this disclosure will be thorough and complete and will fully convey the concept of the invention to those of ordinary skill in the art. The same reference numerals represent the same elements throughout the present disclosure.

Figure 1:
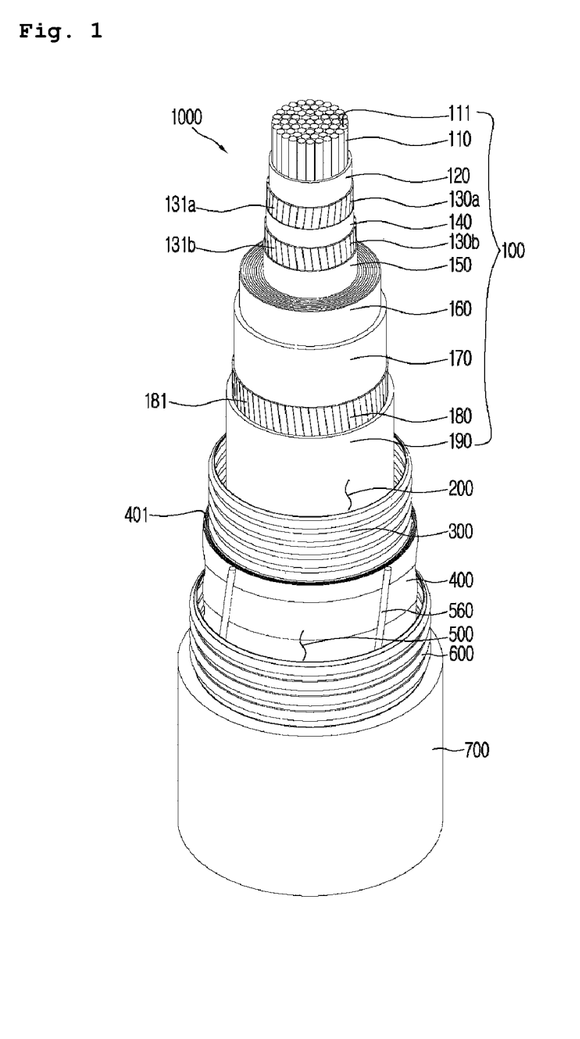
FIG. 1 is a cutaway perspective view of a superconducting wire according to an embodiment of the present invention.
Figure 2:
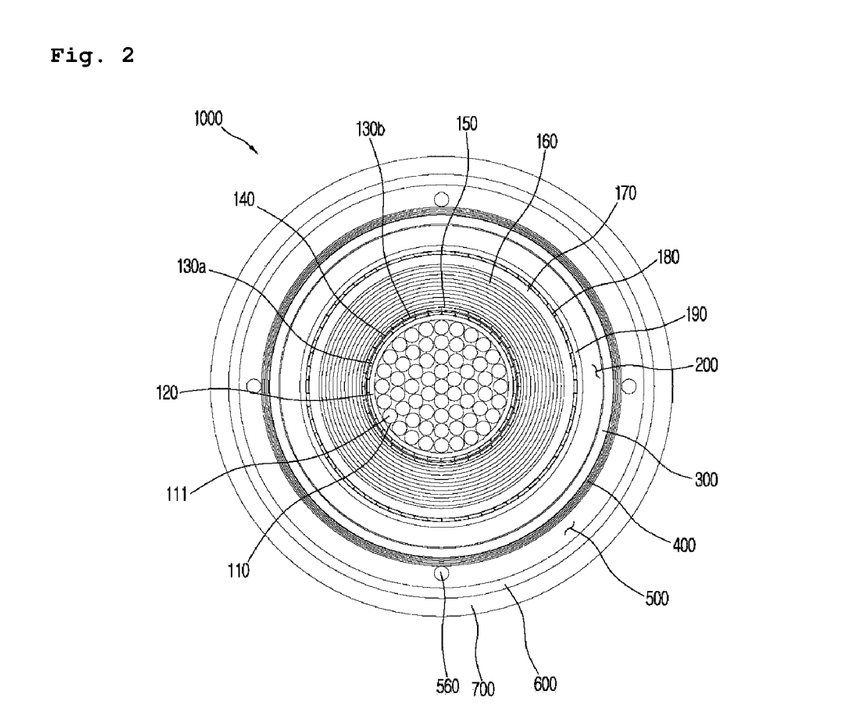
FIG. 2 is a cross-sectional view of the superconducting cable of FIG. 1.

FIG. 1 is a cutaway perspective view of a superconducting cable according to an embodiment of the present invention. FIG. 2 is a cross-sectional view of the superconducting cable of FIG. 1.

A basic structure of a superconducting cable according to the present invention will be described below.

The superconducting cable illustrated in FIG. 1 may include a core part 100 including a former 110, at least one-layer superconducting conductor layer 130 having a plurality of superconducting wires arranged in parallel in a lengthwise direction of the former 110 to cover an outer side of the former 10, an insulating tape 140 covering the superconducting conductor layer 130, and at least one-layer superconducting shield layer 180 having a plurality of superconducting wires arranged in parallel in the lengthwise direction of the former 110 to cover an outer side of the insulating tape 140; a cooling part 200 provided at an outer side of the core part 100 to cool the core part 100 and having a refrigerant channel of a liquid refrigerant for cooling the core part 100; an inner metal conduit 300 provided at an outer side of the cooling part 200; an insulating part 400 provided at an outer side of the inner metal conduit 300 to form an insulating layer wound with an insulator 401 in multiple layer; a vacuum part 500 having a plurality of spacers 560 on a location spaced apart from an outer side of the insulating part 400 to vacuum-insulate the cooling part 200; an outer metal conduit 600 provided at an outer side of the vacuum part 500; and an external jacket 700 provided at an outer side of the outer metal conduit 600 to form a sheath layer.

These elements of the superconducting cable will be sequentially described below. The former 110 may provide a place for installing flat and long superconducting wires around the former 110, serve as a frame for forming a desired shape, and be a path through which fault current flows. The former 110 may have a form in which a plurality of copper (Cu) conductor wires 111 each having a round cross section are compressed into a round shape.

In detail, basically, the former 110 has a round cylindrical shape and may thus serve as a frame on which the flat and long superconducting wires are placed. A diameter of the former 110 is determined in consideration of a width of the superconducting wires, such that the superconducting wires do not peel off and have a structure very similar to a round shape when the superconducting wires are placed on the former 110.

As illustrated in FIGS. 1 and 2, the former 110 may have a solid center part but may have a hollow pipe shape to serve as not only a frame on which the superconducting wires are placed but also a path in which a refrigerant is moved within the former 110. The conductor wires 111 of the former 110 may be formed of copper or the like. The conductor wires 111 may be connected in parallel to the superconducting wires so that the former 110 may serve as a return conductor when fault current is generated in an electric power system due to a system short-circuit (due to quenching, lightning, dielectric breakdown, or the like).

As will be described below, a current-carrying layer attached to each of the superconducting wires and formed of a metal conducting current at room temperature may serve as a return conductor when fault current is generated in the electric power system, as well as the former 110 having the conductor wires 111. The current-carrying layer may be in the form of a metal tape shape, as will be described in detail below.

A cross-sectional area of a conductor (e.g., a copper conductor) of each of the superconducting wires may be determined according to the intensity of fault current. When the fault current has a high voltage, copper wires may be compressed into a round shape and twisted together.

As will be described below, the current-carrying layer formed of a metal conducting electric current at room temperature is provided on opposite surfaces of a superconducting wire according to the present invention so as to reinforce the mechanical rigidity of the superconducting wire. The current-carrying layer reinforces the mechanical rigidity of the superconducting wires to prevent the superconducting wires from being broken due to torsion stress applied thereto during winding of the superconducting wires.

The current-carrying layer may reinforce the mechanical rigidity of the superconducting wire, and serve as a return circuit for fault current when an accident such as a short circuit occurs, together with the former 110. Thus, a former of a superconducting cable to which superconducting wires according to the present invention are applied may have a diameter less than that of a former of a general superconducting cable, as will be described below.

The former 110 has an embossed surface since the conductor wires 111 each having a round cross section of the former 110 are compressed into the round shape and twisted together. Thus, a planarizing layer 120 may be coated on the outer side of the former 110 to planarize the embossed surface of the former 110. The planarizing layer 120 may be formed of a material such as semiconducting carbon paper, a brass tape, or the like.

Although not shown, a cushion layer may be further provided between the planarizing layer 120 and the superconducting conductor layer 130. The cushion layer may be provided using a semiconducting carbon paper tape to protect the superconducting conductor layer 130.

A first superconducting conductor layer 130a may be formed on the outer side of the former 110 planarized by the planarizing layer 120 by winding a plurality of superconducting wires 131 around the outer side of the former 110. The first superconducting conductor layer 130a may be installed such that the superconducting wires 131 are arranged in parallel to be adjacent to each other so as to wind the perimeter of the planarizing layer 120.

Furthermore, as illustrated in FIG. 1, the superconducting conductor layer 130 may be formed in multiple layers according to the intensity of electric current to be transmitted or supplied through the superconducting cable.

In the embodiment of FIG. 1, a total of two superconducting conductor layers 130a and 130b are provided.

When the superconducting conductor layer 130 is formed in multiple layers, the insulating tape 140 may be provided between the superconducting conductor layers 130a and 130b. The insulating tape 140 is provided between the superconducting conductor layers 130a and 130b to control a direction of current in the superconducting conductor layers 130a and 130b of each layer. If the insulating tape 140 is not provided, a path of current may be changed and thus current may not flow in a desired direction. Directions in which current flows through the superconducting conductor layers 130a and 130b stacked in multiple layers may be the same due to the insulating tape 140.

When the insulating tape 140 is additionally provided, a skin effect may be prevented from occurring in the superconducting wire constituting each of the superconducting conductor layers.

In the embodiment of FIG. 1, the superconducting conductor layer 130 includes two layers, i.e., the first superconducting conductor layer 130a and the second superconducting conductor layer 130b, but more than two superconducting conductor layers may be provided if necessary.

Superconducting wires of the superconducting conductor layers 130a and 130b may be connected in parallel to the wires of the former 110, so that while current flows through the superconducting wires, fault current may be shunted to the wires of the former 110 when an accident such as a short circuit (due to quenching, lightning, dielectric breakdown, destruction of a superconductivity condition, or the like)

occurs. The superconducting wires may be prevented from being heated or damaged as described above.

An inner semiconducting layer 150 may be provided at an outer side of the second superconducting conductor layer 130b provided at an outer side of the first superconducting conductor layer 130a. The inner semiconducting layer 150 may be provided to relieve the concentration of an electric field in each region of the superconducting conductor layer 130 and to uniformize an electric field on a surface of the superconducting conductor layer 130. In detail, the inner semiconducting layer 150 may relieve the concentration of an electric field at corners of the superconducting wires and uniformize a distribution of an electric field. An outer semiconducting layer 170 which will be described below may be provided for the same reasons.

The inner semiconducting layer 150 may be provided by rolling a semiconducting tape.

An insulating layer 160 may be provided at an outer side of the inner semiconducting layer 150. The insulating layer 160 may be provided to increase the dielectric strength of the superconducting cable. Generally, a cross-linked polyethylene (XLPE) cable or an oil-filled cable is used to insulate a high-voltage cable. However, the superconducting cable is cooled to extremely low temperature for the superconductivity of superconducting wires thereof but XLPE may be broken at the extremely low temperature, thereby causing dielectric breakdown to occur. The oil-filled cable may cause an environment problem to occur. In contrast, in a superconducting cable to which a superconducting wire according to the present invention is applied, insulating paper which is a general paper material may be used as the insulating layer 160. The insulating layer 160 may be formed by rolling the insulating paper a plurality of times.

Generally, Kraft paper or polypropylene laminated paper (PPLP) is used as the insulating paper. PPLP insulating paper among various types of paper insulating materials is used to easily wind the superconducting cable and in consideration of dielectric strength characteristics.

The outer semiconducting layer 170 may be provided at an outer side of the insulating layer 160. Similarly, the outer semiconducting layer 170 may be provided to relieve the concentration of an electric field in each region of the superconducting conductor layer 130 and to uniformize an electric field on a surface of the superconducting conductor layer 130. The outer semiconducting layer 170 may be also installed by rolling a semiconducting tape.

The superconducting shield layer 180 may be provided at an outer side of the outer semiconducting layer 170. A method of forming the superconducting shield layer 180 may be similar to the method of forming the superconducting conductor layer 130. When the outer semiconducting layer 170 has an uneven surface, a planarizing layer (not shown) may be provided if necessary. Superconducting wires may be arranged in parallel at an outer side of the planarizing layer in a circumferential direction to form the superconducting shield layer 180.

The amount of current to be conducted through a shield layer consisting of second-generation (2G) superconducting wires may be designed to be about 95% of that of current flowing through a superconducting conductor layer, thereby minimizing a stray magnetic field.

A core sheath layer 190 serving as a sheath of the core part 100 may be provided at an outer side of the superconducting shield layer 180. The core sheath layer 190 may include various types of tapes or binders, serve as a sheath to expose the core part 100 via a cooling layer which will be described below, combine all the elements of the core part 100, and be formed of a metal tape such as a SUS material.

The core part 100 of the superconducting cable may be configured as described above. Although FIGS. 1 and 2 illustrate that the planarizing layer and the semiconducting layer are single layers formed of the same material, various additional layers may be added if necessary.

The cooling part 200 may be provided at the outer side of the core part 100. The cooling part 200 may be provided to cool the superconducting wires of the core part 100. The cooling part 200 may include a liquid-refrigerant circulation channel at an inner side thereof. Liquid nitrogen may be used as the liquid refrigerant. The liquid refrigerant (liquid nitrogen) cooled to about −200° C. may circulate through the refrigerant channel to maintain an extremely low-temperature condition which is a superconductivity condition of the superconducting wires of the core part 100 inside the cooling part 200.

The refrigerant channel of the cooling part 200 may cause the liquid refrigerant to flow in one direction. The liquid refrigerant may be collected using a superconducting-cable joint box or the like, and may be cooled and supplied again to the refrigerant channel of the cooling part 200.

The inner metal conduit 300 may be provided at the outer side of the cooling part 200. The inner metal conduit 300 may serve as a sheath of the superconducting cable to prevent the core part 100 from being mechanically damaged during installation and driving of the superconducting cable, together with the outer metal conduit 600 which will be described below. The superconducting cable is wound around a drum to be easily manufactured and transferred, and installed by being unwound from the drum. Accordingly, bending stress or tensile stress may be continuously applied to the superconducting cable.

The inner metal conduit 300 may be provided to maintain the initial performance of the superconducting cable even when such mechanical stress is applied to the superconducting cable. Thus, the inner metal conduit 300 may have a corrugated structure in which peaks and valleys are repeatedly formed in a lengthwise direction of the superconducting cable to reinforce the rigidity of the superconducting cable against mechanical stress. The inner metal conduit 300 may be formed of a material such as aluminum.

The inner metal conduit 300 is provided at the outer side of the cooling part 200 and may thus have extremely low temperature corresponding to the temperature of the liquid refrigerant. Accordingly, the inner metal conduit 300 may be classified as a low-temperature metal conduit.

The insulating part 400 including an insulating layer in which an insular coated thinly with a polymer having low heat conductivity is wound in multiple layers around a metal film having high reflectance may be provided on an outer circumferential surface of the inner metal conduit 300. The insulating layer may be provided to form multi-layer insulation (MLI) and block invasion of heat into the inner metal conduit 300.

In particular, since the inner metal conduit 300 is formed of a metal, heat invasion or exchange is likely to occur through conduction. The insulating part 400 may be mainly used to minimize heat exchange or invasion occurring through conduction, and may also prevent heat exchange or heat occurring through radiation due to the metal film having high reflectance thereof.

The number of layers of the insulating part 400 may be adjusted to minimize thermal invasion. When the insulating part 400 includes a large number of layers, an effect of blocking radiant heat is high but an effect of blocking conductive heat and an effect of blocking heat using convection current occurring when a vacuum layer has a thin thickness are low. Thus, it is important to form the insulating part 400 in an appropriate number of layers.

The vacuum part 500 may be provided at the outer side of the insulating part 400. The vacuum part 500 may be provided to minimize transfer of heat toward the insulation layer due to convection current or the like, caused when heat insulation is not sufficiently conducted by the insulating part 400.

The vacuum part 500 may be formed by forming and vacuumizing a separate space at the outer side of the insulating part 400.

The vacuum part 500 may include at least one spacer 560 to form a physically separate space for blocking invasion of heat to the core part 100 from an outside which is at room temperature through convention current or the like. The at least one spacer 560 may be provided in the separate space to prevent the outer metal conduit 600 or the like outside the separate space included in the vacuum part 500 and the insulating part 400 provided at an inner side of the vacuum part 500 from being in contact with each other in all the regions of the superconducting cable. In detail, the number of spacers 560 may vary according to the type or size of the superconducting cable or the spacer 560. In FIGS. 1 and 2, the superconducting cable 1000 is illustrated as including four spacers but the number of the spacers is variable.

The spacer 560 may be arranged in the lengthwise direction of the superconducting cable, and be wound, in a spiral or round shape, around the outer side of the core part 100, and particularly, the insulating part 400, in a spiral or round shape.

Three to five spacers 560 may be included in the superconducting cable to which the superconducting wire according to the present invention is applied. The spacer 560 may form a separate space to prevent exchange of heat through conduction, and may be formed in one layer or multiple layers.

The spacer 560 may include various types of resin, e.g., a polyethylene (PE) material.

Alternatively, the spacer 560 may be formed of fluororesin (e.g., polytetrafluoroethylene (PTFE) or Teflon (brand name)) if necessary, or may be formed of general resin (e.g., polyethylene) and a surface thereof may be then coated with fluororesin (e.g., PTEE).

PTEE is a type of fluororesin, and is a very stable compound due to a strong chemical bond between fluorine and carbon. Thus, PTEE has characteristics, such as an almost perfect chemical inert property, heat resistance, nonviscosity, high insulation stability, a low friction coefficient, etc.

Furthermore, PTEE is slightly flexible and may thus spirally cover the insulating part 400 and be arranged while being wound in the lengthwise direction of the superconducting cable. In addition, PTEE has a certain degree of hardness and may be thus used as a separating means preventing the insulating part 400 and the outer metal conduit 600 from being in contact with each other, thereby physically maintaining the separate space of the vacuum part 500. The spacer 560 may have a diameter of about 4 mm to 8 mm. A cross section of the spacer 560 may have various shapes, e.g., a round shape, a triangle shape, a tetragonal shape, or a star shape.

The outer metal conduit 600 may be provided at an outer side of the vacuum part 500 having the spacer 560. The outer metal conduit 600 may have same shape and material as the inner metal conduit 300. The outer metal conduit 600 may have a diameter greater than that of the inner metal conduit 300 so that the separate space may be formed using the spacer 560. The spacer 560 will be described in more detail below.

The external jacket 700 serving as a sheath for protecting the inside of the superconducting cable may be provided at an outer side of the outer metal conduit 600. A sheath material which is used as an external jacket of a general power cable may be used as the external jacket 700. The external jacket 700 may prevent the outer metal conduit 600 therein from being corroded and protect the superconducting cable from an external force. The external jacket may be formed of a material such as polyethylene (PE) or polyvinyl chloride (PVC).

Figure 3:
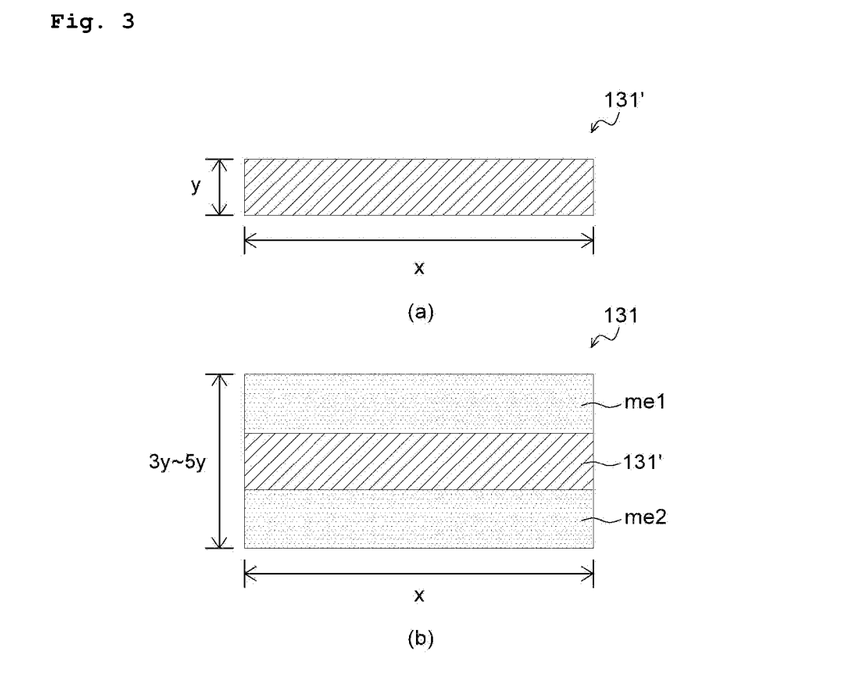
FIG. 3 illustrates an embodiment of a superconducting wire applicable to a superconducting cable.

FIG. 3 illustrates an embodiment of a superconducting wire applicable to a superconducting cable. In detail, FIG. 3(a) is a cross-sectional view of a conventional superconducting wire 131' having no current-carrying layer. FIG. 3(b) is a cross-sectional view of a superconducting wire 131 having added thereon a current-carrying layer formed of a metal conducting current at room temperature.

Superconducting wires of a superconducting cable are spirally wound in a lengthwise direction of the superconducting cable and thus torsion stress is continuously applied thereto. Thus, the superconducting wires may be broken during manufacture or coiling of the superconducting cable. Thus, in the superconducting cable, the former 110 is used as a return conductor when an accident such as a short circuit (due to quenching, lightning, dielectric breakdown, destruction of a superconductivity condition, or the like) occurs.

Current-carrying layers me1 and me2 formed of a metal conducting current at normal temperature are provided on opposite surfaces of a superconducting wire according to the present invention. Thus, the mechanical rigidity of the superconducting wire may be reinforced, and the current-carrying layers me1 and me2 may serve as a return conductor together with the former 110 when a short-circuit accident occurs in a superconducting system. Thus, the former 110 may have a diameter less than that of a former of a superconducting cable employing a superconducting wire which does not include the current-carrying layers me1 and me2. Accordingly, a diameter and weight of the whole superconducting cable may be reduced, as will be described in detail below.

The conventional superconducting wire 131' of FIG. 3(a) has a width of x mm and a thickness of y mm. In contrast, in the superconducting wire 131 of FIG. 3(b) according to the present invention, the current-carrying layers me1 and me2 formed of a metal and having a width of x mm and a thickness of y mm to 2y mm are respectively added onto opposite surfaces thereof, compared to the conventional superconducting wire 131'.

Thus, the superconducting wire 131 according to the present invention includes a current-carrying layer having a thickness of y mm to 2y mm and may thus have a whole thickness of 3y mm to 5y mm, compared to the conventional superconducting wire 131'.

A superconducting wire used in an experiment which will be described below had a width of 0.4 mm to 0.5 mm and a thickness of 0.3 mm to 0.5 mm, i.e., y=0.1.

The current-carrying layers me1 and me2 may be soldered as will be described below and added to a conventional semiconductor wire.

If the current-carrying layers me1 and me2 are respectively added to the opposite surfaces of the superconducting wire 131 by soldering, and side surfaces of the superconducting wire 131 are soldered or all surfaces of the superconducting wire 131 are coated with a metal, fault current may be shunted to the current-carrying layers me1 and me2 added to not only the superconducting wire 131 but also the wires of the former 110 connected in parallel to the superconducting wire 131 when an accident such as a short circuit occurs. Thus, the current-carrying layers me1 and me2 may serve as a return conductor, together with the former 110.

Although each of the current-carrying layers me1 and me2 had a width of x mm and a thickness of y mm to 2y mm, the current-carrying layers me1 and me2 were respectively added to the opposite surfaces of a conventional superconducting wire having a thickness of y mm. Thus, a current-carrying capability may be greater due to the surface effect or the like than that when only one current-carrying layer having a thickness of 2y mm to 4y mm is added to a surface of the conventional superconducting wire.

The rigidity of a superconducting wire may be reinforced by minimizing separation of a current-carrying layer during bending of the superconducting wire when the current-carrying layer is added to opposite surfaces of the superconducting wire than when the current-carrying layer is added to only a surface of the superconducting wire. Furthermore, when the current-carrying layer is used as a return conductor, the current-carrying layer may be preferably added to the opposite surfaces of the superconducting wire. In this case, the diameter of the former may be decreased.

Here, when a conventional superconducting wire had a thickness of about 0.1 mm and each current-carrying layer had a thickness of about 0.1 mm to 0.2 mm, the superconducting wire according to the present invention had a thickness of 0.3 mm to 0.5 mm. Although it appeared that the thickness of the superconducting wire according to the present invention was greater than that of the conventional superconducting wire, the thickness of the improved superconducting wire was similar to that of a thin film and thus had no significant effect on the thickness of a whole superconducting cable. However, a cross-sectional area of the former crowded with uninsulated wires may be decreased by about 10 to 40 percentages as described above.

The superconducting wire according to the present invention had a width of 0.4 mm to 0.5 mm and a thickness of 0.3 mm to 0.5 mm, and used YBCO or ReBCO (here, Re=Sm, Gd, Nd, Dy, Ho) as a superconducting material. A critical current DC Ic may be 150 A to 500 A at a temperature of 77K, under pressure of 1 atmosphere and at a self-field.

Figure 4:
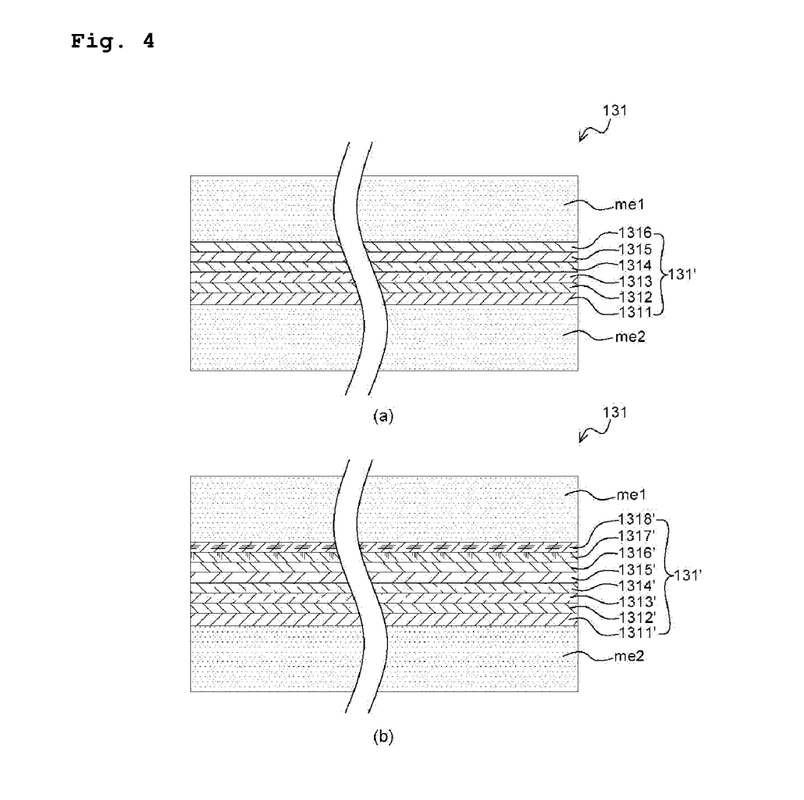
FIG. 4 is a cross-sectional view illustrating embodiments of a superconducting wire applicable to a superconducting cable according to the present invention.

FIG. 4 is a cross-sectional view of embodiments of a superconducting wire according to the present invention.

In detail, FIG. 4(a) is a cross-sectional view of a superconducting wire applicable to a superconducting cable, according to an embodiment of the present invention. FIG. 4(b) is a cross-sectional view of a superconducting wire according to another embodiment of the present invention.

For convenience of explanation, a superconducting wire 131 of a superconducting conductor layer will be described as an embodiment below.

A superconducting wire according to the present invention may be a first-generation (1G) superconducting wire or a 2G superconducting wire.

A phenomenon that an electric resistance becomes zero at a specific temperature or less is referred to as superconductivity. Superconductivity occurring at about 100K (−173° C.) which is higher than 0 K which absolute zero (−273° C.) is referred to as high-temperature superconductivity. In the field of power cable, a high-temperature superconductor is used as a superconducting wire. Recently, a coated conductor (CC) type 2G wire consisting principally of YBCO or ReBCO has been introduced. The 2G superconducting wire should be understood to mean a superconducting wire in which a YBCO or ReBCO material (here, Re=Sm, Gd, Nd, Dy, Ho) is generally used as a superconducting material of a deposition layer thereof.

The 2G superconducting wire will now be described in detail. The 2G superconducting wire may include a metal substrate layer, a deposition layer, a silver (Ag) layer, etc. The metal substrate layer may be used as a base member of the superconducting wire, maintain the mechanical strength of the superconducting wire, and be formed of a material such as Hastelloy or a nickel-tungsten (Ni—W) alloy. The deposition layer may include a buffer layer for depositing a superconducting layer on a metal substrate, and the superconducting layer to be used as a conduction path when current is conducted.

The silver (Ag) layer may be a silver (Ag) or copper (Cu) alloy layer. The silver (Ag) alloy layer may be located between the superconducting layer and the copper (Cu) alloy layer to enable layer deposition. The copper (Cu) alloy layer may reinforce the mechanical strength of the superconducting wire. A thickness and a material of each of these alloy layers may vary according to the type of a device to which they are applied. Each of these alloy layers is capable of conducting current at room temperature.

The superconducting wire of FIG. 4 according to the present invention may be a 2G superconducting wire and may use a metal substrate layer formed of Hastelloy or a nickel-tungsten (Ni—W) alloy. FIG. 4 illustrates embodiments in which two types of superconducting wires are applied.

A superconducting wire according to the present invention may have a width of 0.4 mm to 0.5 mm and a thickness of 0.3 mm to 0.5 mm, may use YBCO or ReBCO (here, Re=Sm, Gd, Nd, Dy, Ho) as a superconducting material, and critical current DC Ic may be 150 A to 500 A at a temperature of 77 K, under pressure of 1 atmosphere and at a self-field. Here, the self-field should be understood to mean a magnetic field environment generated due to current flowing through the semiconductor wire.

The critical current may be continuously measured at time intervals of about 0.5 m to 1 m with respect to a superconducting wire which is a measurement target. In this case, the critical current means a maximum current which may flow when a DC voltage is continuously applied (before the occurrence of a short circuit due to quenching or the like).

FIG. 4(a) is a cross-sectional view of a superconducting wire 131 using an YBCO-based superconductive material. FIG. 4(b) is a cross-sectional view of a superconducting wire 131 using a ReBCO-based superconductive material.

A material of a metal substrate layer 1311 of the superconducting wire 131 of FIG. 4(a) may be a nickel-tungsten (Ni—W) alloy. The metal substrate layer 1311 may be in the form of a metal tape.

Deposition layers including a plurality of buffer layers 1312, 1313, and 1314 and an YBCO-based superconducting layer 1315 may be provided on the metal substrate layer 1311 formed of the nickel-tungsten (Ni—W) alloy.

In the embodiment of FIG. 4(a), the three buffer layers 1312, 1313, and 1314 may be deposited. In detail, the buffer layers may be layers formed of a material such as $Y_2O_3$, YSZ, or $CeO_2$. The YBCO-based superconducting layer 1315 may be provided on the buffer layers. A silver (AG) layer 1316 may be provided at an outer side of the superconducting layer 1315 to protect the superconducting wire 131.

Current-carrying layers me1 and me2 formed of a metal may be provided the top and bottom of the superconducting wire 131 of FIG. 4(*a*), i.e., below the substrate layer 1311 and on the silver (Ag) layer 1316.

The reason why the current-carrying layers me1 and me2 are provided at both opposite sides of the superconducting wire 131 is that the physical rigidity of the superconducting wire 131 may be more reinforced, a deviation in the physical property of the superconducting wire 131 according to a direction in which it is bent may be minimized, and a capacity of a return conductor may be increased as described above, compared to when a current-carrying layer is provided at only one side of the superconducting wire 131.

Furthermore, although a current-carrying function of the superconducting wires 131 of each superconducting conductor layer or a superconducting shield layer is performed according to a capacity designed on an assumption that the superconductivity condition is maintained, current flowing through superconducting wire 131 may be conducted through the former 110 described above when the superconductivity condition is destructed due to a system error or the like. A diameter of the former 110 or the number of conductor wires may be determined according to a capacity for conducting fault current.

However, the diameter of the former 110 occupies a large part of the diameter of a whole superconducting cable and should thus be decreased to handle conduction of fault current, thereby decreasing the diameter or weight of the whole superconducting cable.

Thus, as illustrated in FIG. 4, the current-carrying layers me1 and me2 formed of a metal, e.g., a brass material, may be provided on the top and bottom of the superconducting wire 131 to reinforce the rigidity of the superconducting wire 131, use the superconducting wire 131 as a return conductor of fault current, and minimize the diameter of the former 110 or the like.

The current-carrying layers me1 and me2 formed of the metal may be in a metal thin-film form, and particularly, formed of a brass material.

Brass is an alloy made by adding zinc to copper. A material of the current-carrying layers me1 and me2 may be replaced with a copper alloy having high electrical conductivity instead of brass.

In the following description, the term "current-carrying layer formed of a brass material" may be understood to mean a concept including a copper alloy as well as brass.

The current-carrying layers me1 and me2 formed of a metal such as brass may be added in the form of a metal thin-film such as a brass thin-film. The brass thin film may have a thickness of 0.1 mm to 0.2 mm. If a current-carrying layer me formed of a metal and added in the form of a brass tape to a side of the superconducting wire 131 has a thickness of 0.125 mm, the whole superconducting wire 131 may have a thickness of about 0.4 mm.

If a current-carrying layer formed of a metal and provided on at least one surface of the superconducting wire 131 has a thickness of 0.1 mm or less, the rigidity of the superconducting wire 131 may be difficult to sufficiently reinforce. If the current-carrying layer formed of the metal has a thickness of 0.2 mm or more, the current-carrying layer formed of the metal may be separated, when bent, from the surface of the superconducting wire 131 including the current-carrying layer, and the thickness of the whole superconducting wire 131 including the current-carrying layer may be extremely thick.

In one embodiment, the superconducting wire 131 may have a thickness of about 0.1 m and the thickness thereof may be increased three or four times, i.e., to 0.35 mm by adding a metal current-carrying layer which is in a brass tape form having a thickness of 0.125 mm to opposite sides of the superconducting wire 131. Nonetheless, the whole superconducting wire 131 has a very thin thickness of less than 1 mm and has no significant effect on the thickness of a whole superconducting cable. However, since the rigidity of the superconducting wire 131 may be reinforced and thus the superconducting wire 131 may serve as a return conductor of fault current, the diameter or weight of the former may be small.

In other words, the rigidity of the superconducting wire 131 may be reinforced and the diameter or weight of the former may be decreased by providing the current-carrying layers me1 and me2 formed of brass as metal thin-films on the top and bottom of the superconducting wire 131. Thus, the diameter or weight of the former when a current-carrying layer having a predetermined thickness is provided at outer sides of both the metal substrate layer and the silver (Ag) layer of the superconducting wire 131 may be less than that when the current-carrying layer is not provided on the superconducting wire 131.

As described above, if fault current is generated when the current-carrying layers me1 and me2 are attached onto opposite sides of the superconducting wire 131 using solders or the like, the current-carrying layers me1 and me2 attached to the superconducting wire 131 should be electrically connected to each other so that current flowing through the superconducting layer of the deposition layer 1315 may flow to the current-carrying layers me1 and me2.

Thus, the superconducting wire 131 and the current-carrying layers me1 and me2 attached to opposite sides of the superconducting wire 131 may be connected in parallel to conduct fault current. Although not shown in FIG. 4, in order to electrically connect the superconducting wire 131 and the current-carrying layers me1 and me2 attached to the opposite sides of the superconducting wire 131, the side surfaces of the superconducting wire 131 may be soldered using metal base solders or the superconducting wire 131 may be plated with a metal having high electrical conductivity, e.g., copper (Cu).

In the two methods, the current-carrying layers me1 and me2 and the superconducting wire 131 may be electrically connected while minimizing an increase in the thickness or volume of the superconducting wire 131 to which the current-carrying layers me1 and me2 are attached.

When the metal substrate layer 1311, the deposition layers 1312 to 1315 including superconducting layers, and the silver (Ag) layer 1316 of the superconducting wire 131 are electrically connected in parallel to one another by copper plating or by soldering the side surfaces thereof as described above, the superconducting layer 1315, the metal substrate layer 1311, the silver (Ag) layer 1316, and the current-carrying layers me1 and me2 may be electrically connected, and fault current may be thus shunted to the metal substrate layer 1311 and the silver (Ag) layer 1316, as well as the current-carrying layers me1 and me2.

The current-carrying layers me1 and me2 may be soldered and attached as the metal thin films onto the superconducting wire 131. Solders for soldering the current-carrying layers me1 and me2 onto the opposite sides of the superconducting wire 131 may be formed of tin (Sn), lead (Pb) and silver (Ag) and may have a melting point of 200° C. or less. In addition to the above-described solder materials, various types of solders or various attaching methods are applicable provided that the current-carrying layers me1 and me2 and the metal substrate layer 1311 or the silver (Ag) layer 1316 of the superconducting wire 131 can be attached to conduct current therethrough.

FIG. 4(b) illustrates a superconducting wire 131' formed of a ReBCO-based superconductive material. Parts of FIG. 4(b) which are the same as those described above with reference to FIG. 4(a) are not redundantly described again here.

A material of a metal substrate layer 1311' of the superconducting wire 131' of FIG. 4(b) may be a nickel-tungsten (Ni—W) alloy. Similarly, the metal substrate layer 1311' may be in the form of a metal thin film.

Deposition layers 1312' to 1317' including at least six layers, i.e., buffer layers 1312', 1313', 1314', 1315', and 1316' and a ReBCO-based superconducting layer 1317', may be provided on the metal substrate layer 1311' formed of the Ni—W alloy. A silver (Ag) layer 1318' may be provided at an outer side of the deposition.

Seed layers of the respective buffer layers 1312', 1313', 1314', 1315', and 1316' may include an $Al_2O_3$ layer, an $Y_2O_3$ layer, an IBAD-MGo layer, an EPI-MGo layer, and a $LaMoO_3$ layer.

Similar to the embodiment of the superconducting wire 131 of FIG. 4(a), the superconducting wire 131' of FIG. 4(b) may include current-carrying layers me1 and me2 at outer sides of the metal substrate layer 1311' and the silver (Ag) layer 1318' to reinforce physical rigidity and shunt fault current.

As described above, a diameter of a former serving as a return conductor of fault current may be decreased by providing a current-carrying layer, which is a metal thin film formed of brass or the like, at opposite sides of the superconducting wire 131' and by using the current-carrying layer as a means for conducting fault current.

Similarly, the metal substrate layer 1311' and the silver (AG) layer 1318' of the superconducting wire 131' of FIG. 4(b) are formed of a metal and thus have a function of bypassing fault current. However, cross-sectional areas of the metal substrate layer 1311' and the silver (AG) layer 1318' are not large when compared to the thickness of a conventional superconducting wire. Thus, fault-current bypassing capacities of the metal substrate layer 1311' and the silver (AG) layer 1318' are small.

However, as described above, a current-carrying layer me formed of a metal has a thickness of about 0.125 mm and thus the diameter of a former serving as a return circuit of fault current may be influenced by the amount of electric current conducted through the current-carrying layer me as described above.

Thus, when the diameter of the former is designed, the diameter of the former may be set to be less than that of a conventional former by taking into account the amount of fault current conducted through the metal substrate layer 1311' and the silver (Ag) layer 1318', as well as the current-carrying layer me formed of the metal and included in the superconducting wire 131' of the superconducting conductor layer. A maximum allowable amount of current may be determined according to a thermal analysis method performed by conducting fault current through the current-carrying layer me formed of the metal, the metal substrate layer 1311', and the silver (Ag) layer 1318' of the superconducting wire 131'. Accordingly, the diameter of the former may be designed to be smaller.

Figure 5:
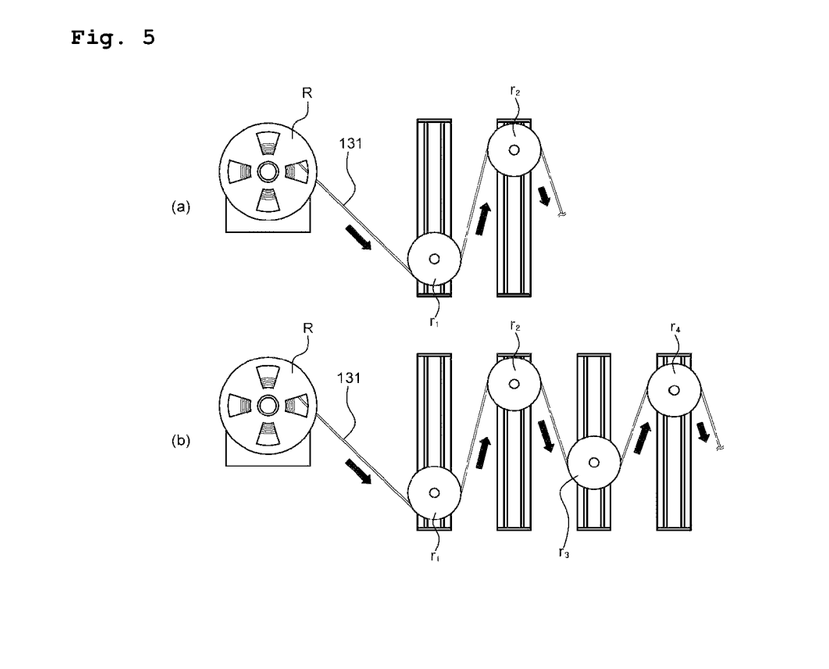
FIG. 5 illustrates test equipment for testing a superconducting wire according to the present invention.

FIG. 5 illustrates test equipment for testing a superconducting wire according to the present invention. In detail, FIG. 5(a) illustrates equipment for measuring a critical current when bending stress is applied. FIG. 5(b) illustrates equipment for measuring a critical current when double bending stress is applied.

The critical current when bending stress is applied may be measured by moving a superconducting wire 131 along two rollers after sequentially bending the superconducting wire 131 indifferent directions. The critical current when double bending stress is applied may be measured by moving the semiconductor wire 131 along four rollers after bending sequentially the superconducting wire 131 in different directions.

When the superconducting wire 131 according to the present invention to which the current-carrying layers me1 and me2 formed of brass are added had a thickness of 3y to 5y as illustrated in FIG. 3(b), tensile strength of the superconducting wire 131 having added thereon the current-carrying layers me1 and me2 as metal thin films conducting current at normal temperature was 200 MPa to 800 MPa with respect to a 95% current attenuation (IC relentation) criterion. Accordingly, the superconducting wire 131 had sufficient rigidity when it was wound around a superconducting cable.

The 95% current attenuation (IC relentation) criterion should be understood to mean that at least 95% of the amount of electric current conducted may be secured even when a tensile force of 200 MPa to 800 MPa is applied to the superconducting wire 131, when a test method is performed to measure a tensile force by gradually increasing a tensile force applied to opposite ends of the superconducting wire 131 until 95% of an initial amount of electric current conducted is secured. In another aspect, this condition may be understood to mean that test methods described above with reference to FIGS. 5 to 7 can be passed. That is, in the following description, it may be understood to mean that a required physical or electrical property can be measured by predetermining stress conditions and determining whether a critical current is greater than or equal to 95% of a critical current of the superconducting wire 131 at normal times, under the stress conditions.

As illustrated in FIG. 5(a), a critical current when bending stress was applied to a superconducting wire having a metal layer according to the present invention using two rollers r1 and r2 each having a diameter of 35 mm after the superconducting wire was bent sequentially in different directions was greater than or equal to 95% of a critical current of the superconducting wire when no bending stress was applied thereto.

Furthermore, as illustrated in FIG. 5(b), a critical current when double bending stress was applied to the semiconductor layer having the metal layer according to the present invention using four rollers r1, r2, r3 and r4 each having a diameter of 50 mm after the superconducting wire was bent sequentially in different directions was greater than or equal to 95% of a critical current of the superconducting wire when no bending stress was applied thereto.

As described above, a superconducting wire according to the present invention includes a metal layer and thus may have sufficient physical rigidity during the manufacture or installation of a superconducting cable, and satisfies the condition that a critical current of the superconductor wire when bending stress, tensile stress, or torsion stress is applied thereto should be greater than or equal to 95% of that of the superconducting wire when such stress is not applied thereto.

In detail, a critical current of the superconducting wire according to the present invention when a tensile force of 250 MPa or a tensile strength extending the superconducting wire by 0.2% is applied in a lengthwise direction of the superconducting wire may be greater than or equal to 95% of that of the superconducting wire when the tensile stress is not applied thereto. A critical current of the superconducting wire according to the present invention when torsion is applied thereto in the lengthwise direction at time intervals of 200 mm may be greater than or equal to 95% of that of the superconducting wire when torsion is not applied thereto.

In relation to torsion stress, a critical current of the superconducting wire according to the present invention when torsion is applied thereto in the lengthwise direction at time intervals of 200 mm is preferably greater than or equal to 95% of that of the superconducting wire when torsion is not applied thereto.

Generally, jointing the superconducting wire 131 is preferably performed three times or less within a distance of 1 kilometer or less to decrease contact resistance. Accordingly, the jointing of the superconducting wire 131 may be performed in units of 200 meters to 400 meters, and a resistance value at each jointed portion of the superconducting wire 131 may be 200 n$\Omega$ or less (a range of 100 n$\Omega$ to 200 n$\Omega$).

Alternating current (AC) loss of the superconducting wire according to the present invention is preferably 0.4 W/kA*m or less. Here, the AC loss of 0.4 W/kA*m or less should be understood to mean that loss incurred when an AC current of 1 kA is conducted through a single superconducting wire having a length of 1 m should be 0.4 W or less, and defines a range of AC loss with respect to a single superconducting wire other than a superconducting cable.

Furthermore, even when a tensile force and torsion are simultaneously applied, the critical current condition and the resistance condition at the jointed portions of the superconducting wire should be satisfied.

A superconducting wire according to the present invention may be jointed in a lengthwise direction of a cable and a joint resistance value at each jointed portion thereof may be 200 n$\Omega$ or less. Measuring the joint resistance is based on a premise that mechanical stress is not applied to the superconducting wire. It is preferable that the joint resistance at each jointed portion is not increased by 20% or more even when tension is applied to the superconducting wire and the superconducting wire is wound around a former of the superconducting cable or the like.

In conclusion, it is preferable that the joint resistance is 240 n$\Omega$ or less when the superconducting wire is wound around the former of the superconducting cable at a pitch of about 220 mm and even when a load, i.e., a tensile force, of 3 kg to 8 kg is applied in the lengthwise direction of the superconducting wire or is higher by 20% or less than a joint resistance at normal times.

The durability and current-carrying capability of the superconducting wire during the manufacture or installation of a superconducting cable may be guaranteed when an electrical property of the semiconducting wire satisfy a condition that a critical current of a superconducting wire when physical stress is applied is greater than or equal to about 95% of that of the superconducting wire when no physical stress is applied thereto.

Figure 6:
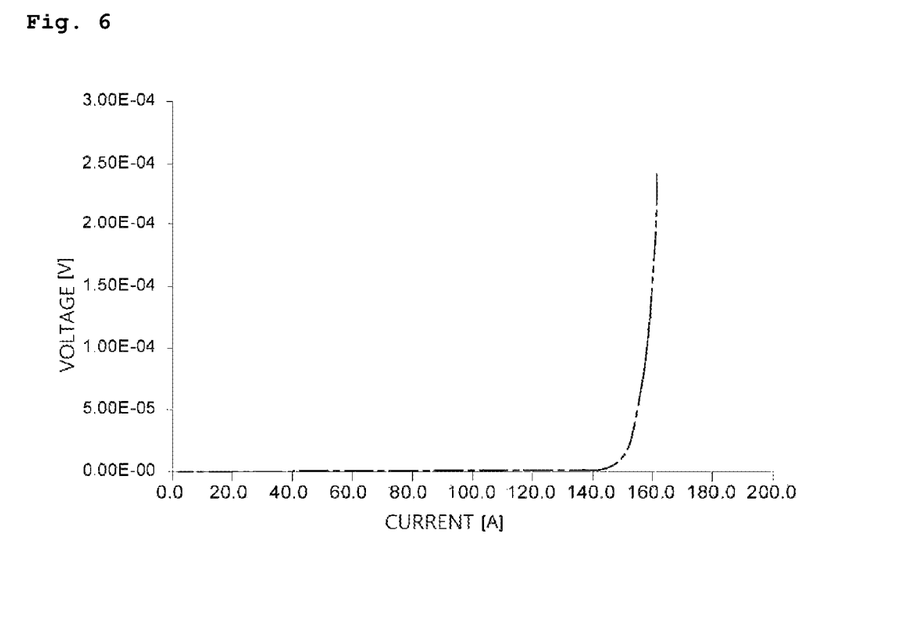
FIG. 6 is a graph showing a voltage versus a current conducted through a superconducting wire.

FIG. 6 is a graph showing a voltage versus a current conducted through a superconducting wire.

A critical current means a maximum current which may flow when a DC voltage is continuously applied (before the occurrence of a short circuit due to quenching or the like). Thus, when a current greater than or equal to the critical current is conducted, resistance sharply increases and thus a voltage also sharply increases. Accordingly, it is not preferable that an incremental ratio of a voltage is extremely high.

It is preferable that in a 2G superconducting wire according to the present invention, a slope n of a voltage with respect to a current greater than or equal to the critical current satisfies a range of 25 to 30. The slope n may be automatically measured when the critical current is measured.

Figure 7:
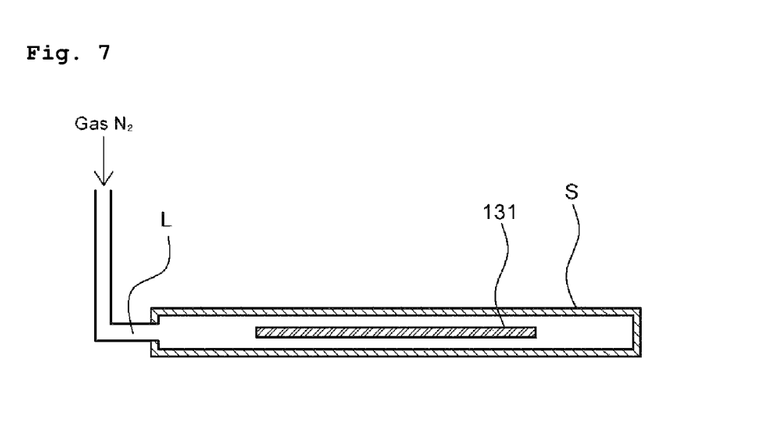
FIG. 7 illustrates test equipment for testing hermeticity of a superconducting wire according to the present invention.

FIG. 7 illustrates test equipment for testing hermeticity of a superconducting wire according to the present invention.

The hermeticity of the superconducting wire should be understood to mean that the superconducting wire does not balloon and can maintain an original form thereof when immersed into high-pressure liquid nitrogen and thus a critical current is guaranteed to fall within a predetermined range.

In a test method, as illustrated in FIG. 7, liquid nitrogen L may be filled into a metal conduit S in which a superconducting wire 131 is arranged, pressure may be continuously applied to the liquid nitrogen L for about 16 hours from the outside such that the metal conduit S has an internal pressure of about 30 atm, whether the superconducting wire 131 balloons may be inspected with naked eyes, and thereafter, a critical current may be measured.

Under the above-described test conditions, if the superconducting wire 131 does not balloon when inspected with naked eyes and the critical current is maintained greater than or equal to about 95% of a critical current at normal times, the hermeticity conditions are satisfied.

Although exemplary embodiments of the present invention are described in the present disclosure, would be apparent to those of ordinary skill in the art that the present invention may be embodied in many different forms without departing from the idea and scope of the invention as defined in the appended claims. Therefore, the scope of the invention should be defined by the appended claims, and all differences within the scope will be construed as being included in the present invention.

The invention claimed is:

1. A superconducting wire having a width of 0.4 mm to 0.5 mm and a thickness of 0.3 mm to 0.5 mm and formed of YBCO or ReBCO (Re=Sm, Gd, Nd, Dy, Ho) as a superconductive material, wherein a critical current DC Ic is in a range of 150 A to 500 A at a temperature of 77 K, under pressure of 1 atmosphere, and at a self-field.

2. The superconducting wire of claim 1, wherein a critical current when bending stress is applied to the superconducting wire using two rollers each having a diameter of 35 mm after the superconducting wire is sequentially bent in different directions is greater than or equal to 95% of the critical current DC Ic.

3. The superconducting wire of claim 1, wherein a critical current when double bending stress is applied to the superconducting wire using four rollers each having a diameter of 50 mm after the superconducting wire is sequentially bent in different directions is greater than or equal to 95% of the critical current DC Ic.

4. The superconducting wire of claim 1, wherein a tensile critical current when a tensile force of 250 MPa or a tensile strength extending the superconducting wire by 0.2% is applied in a lengthwise direction of the superconducting wire is greater than or equal to 95% of the critical current DC Ic.

5. The superconducting wire of claim 1, wherein a torsion critical current when the superconducting wire is twisted at intervals of 200 mm in a lengthwise direction of the superconducting wire is greater than or equal to 95% of the critical current DC Ic.

6. The superconducting wire of claim 1, wherein a critical current when the superconducting wire is wound around a former of a superconducting cable at a pitch of about 220 mm and a load of 3 kg to 8 kg is applied in a lengthwise direction of the superconducting wire is greater than or equal to 95% of the critical current DC Ic.

7. The superconducting wire of claim 1, wherein the superconducting wire is jointed in units of 200 meters to 400 meters, and
a joint resistance value at jointed portions of the superconducting wire is 200 n$\Omega$ or less.

8. The superconducting wire of claim 7, wherein the joint resistance value at the jointed portions of the superconducting wire when the superconducting wire is wound around a former of a superconducting cable at a pitch of about 220 mm and a load of 3 kg to 8 kg is applied in a lengthwise direction of the superconducting wire is 240 n$\Omega$ or less or is greater by 20% or less than a joint resistance value at normal times.

9. The superconducting wire of claim 1, wherein a critical current when the superconducting wire is immersed for 16 hours in liquid nitrogen having an internal pressure maintained at about 30 MPa is greater than or equal to 95% of the critical current DC Ic.

10. The superconducting wire of claim 1, wherein the superconducting wire does not balloon when immersed for 16 hours in liquid nitrogen having an internal pressure maintained at about 30 MPa and when inspected with naked eyes.

11. The superconducting wire of claim 1, wherein a slop of a voltage with respect to a current greater than or equal to the critical current DC Ic is in a range of 25 to 30.

12. The superconducting wire of claim 1, wherein alternating-current (AC) loss of the superconducting wire is 0.4 W/kA*m or less.

13. A superconducting wire having a width of 0.4 mm to 0.5 mm and a thickness of 0.3 mm to 0.5 mm and formed of YBCO or ReBCO (here, Re=Sm, Gd, Nd, Dy, Ho) as a superconductive material, wherein a critical current DC Ic is in a range of 150 A to 500 A at a temperature of 77 K, under pressure of 1 atmosphere, and at a self-field,
wherein a critical current when bending stress is applied to the superconducting wire using two rollers each having a diameter of 35 mm after the superconducting wire is sequentially bent in different directions is greater than or equal to 95% of the critical current DC Ic,
wherein a critical current when double bending stress is applied to the superconducting wire using four rollers each having a diameter of 50 mm after the superconducting wire is sequentially bent in different directions is greater than or equal to 95% of the critical current DC Ic,
wherein a critical current when a tensile force of 250 MPa or a tensile strength extending the superconducting wire by 0.2% is applied in a lengthwise direction of the superconducting wire is greater than or equal to 95% of the critical current DC Ic,
wherein a critical current when the superconducting wire is twisted at intervals of 200 mm in the lengthwise direction is greater than or equal to 95% of the critical current DC Ic, and
wherein a critical current when the superconducting wire is wound around a former of a superconducting cable at a pitch of about 220 mm and a load of 3 kg to 8 kg is applied in the lengthwise direction or when the superconducting wire is immersed for 16 hours in liquid nitrogen having an internal pressure maintained at about 30 MPa is greater than or equal to 95% of the critical current DC Ic,
wherein the superconducting wire is jointed in units of 200 meters to 4000 meters,
wherein a joint resistance value at jointed portions of the superconducting wire is 200 n$\Omega$ or less,
wherein a joint resistance value when the superconducting wire is wound around a former of a superconducting cable at a pitch of about 220 mm and a load of 3 kg to 8 kg is applied in the lengthwise direction of the superconducting wire is 240 n$\Omega$ or less or is greater by 20% or less than a joint resistance value at normal times,
wherein a slop of a voltage with respect to a current greater than or equal to the critical current DC Ic is in a range of 25 to 30, and
wherein alternating-current (AC) loss of the superconducting wire is 0.4 W/kA*m or less.

14. A superconducting wire having a width of 0.4 mm to 0.5 mm and a thickness of 0.3 mm to 0.5 mm and formed of YBCO or ReBCO (here, Re=Sm, Gd, Nd, Dy, Ho) as a superconductive material, wherein the superconducting wire does not balloon when immersed for 16 hours in liquid nitrogen having an internal pressure maintained at about 30 MPa and when inspected with naked eyes.

15. A superconducting wire having a width of 0.4 mm to 0.5 mm and a thickness of 0.3 mm to 0.5 mm and formed of YBCO or ReBCO (here, Re=Sm, Gd, Nd, Dy, Ho) as a superconductive material, wherein a critical current DC Ic is in a range of 150 A to 500 A at a temperature of 77 K, under pressure of 1 atmosphere, and at a self-field,
wherein a critical current when bending stress is applied to the superconducting wire using two rollers each having a diameter of 35 mm after the superconducting wire is sequentially bent in different directions is greater than or equal to 95% of the critical current DC Ic,
wherein a critical current when double bending stress is applied to the superconducting wire using four rollers each having a diameter of 50 mm after the superconducting wire is sequentially bent in different directions is greater than or equal to 95% of the critical current DC Ic,
wherein a critical current when a tensile force of 250 MPa or a tensile strength extending the superconducting wire by 0.2% is applied in a lengthwise direction of the superconducting wire is greater than or equal to 95% of the critical current DC Ic,
wherein a critical current when the superconducting wire is twisted at intervals of 200 mm in the lengthwise direction is greater than or equal to 95% of the critical current DC Ic, and
wherein a critical current when the superconducting wire is wound around a former of a superconducting cable at a pitch of about 220 mm and a load of 3 kg to 8 kg is applied in the lengthwise direction or when the superconducting wire is immersed for 16 hours in liquid nitrogen having an internal pressure maintained at about 30 MPa is greater than or equal to 95% of the critical current DC Ic,
wherein the superconducting wire is jointed in units of 200 meters to 4000 meters,
wherein a joint resistance value at jointed portions of the superconducting wire is 200 n$\Omega$ or less,
wherein a joint resistance value when the superconducting wire is wound around a former of a superconducting cable at a pitch of about 220 mm and a load of 3 kg to 8 kg is applied in the lengthwise direction of the superconducting wire is 240 nΩ or less or is greater by 20% or less than a joint resistance value at normal times, wherein a slop of a voltage with respect to a current greater than or equal to the critical current DC Ic is in a range of 25 to 30, wherein alternating-current (AC) loss of the superconducting wire is 0.4 W/kA*m or less, and wherein the superconducting wire does not balloon when immersed for 16 hours in the liquid nitrogen having the internal pressure maintained at about 30 MPa and when inspected with naked eyes.

* * * * *